United States Patent [19]

Brookner et al.

[11] Patent Number: 4,783,745
[45] Date of Patent: Nov. 8, 1988

[54] NONVOLATILE MEMORY UNLOCK FOR AN ELECTRONIC POSTAGE METER

[75] Inventors: George M. Brookner, Norwalk; John H. Soderberg, Stratford, both of Conn.

[73] Assignee: Pitney Bowes Inc., Stamford, Conn.

[21] Appl. No.: 823,901

[22] Filed: Jan. 30, 1986

[51] Int. Cl.[4] .......................... G06F 3/00; G06F 15/00
[52] U.S. Cl. ............................... 364/464.02; 364/466; 364/900
[58] Field of Search ............... 364/466, 467, 200, 900; 177/25; 340/825.3; 380/25

[56] References Cited

U.S. PATENT DOCUMENTS

| | | | |
|---|---|---|---|
| 4,301,507 | 11/1981 | Soderberg et al. | 364/464 |
| 4,424,573 | 1/1984 | Eckert, Jr. et al. | 364/900 |
| 4,506,329 | 3/1985 | Duwol et al. | 364/464 |
| 4,525,786 | 6/1985 | Crowley et al. | 364/900 |

*Primary Examiner*—Felix D. Gruber
*Assistant Examiner*—Ellis B. Ramirez
*Attorney, Agent, or Firm*—Charles G. Parks, Jr.; David E. Pitchenik; Melvin J. Scolnick

[57] ABSTRACT

An electronic postage meter is disclosed which includes one or more nonvolatile memories (NVM) for storing a hierarchy of secure data including the meter's unique serial number, accounting information, and various parameters which define its operating characteristics. The portion or portions of NVM containing the serial number and the aforementioned information and parameters may be totally or partially "locked" by firmware that causes one or more "lock bits" to be set. The setting of the lock bits is designed to prevent unauthorized access to a program which can alter the contents of predetermined portions of NVM. The disclosed postage meter is further operable to enable authorized personnel to "unlock" said program in order to initialize, modify and/or reconfigure the meter both during the manufacturing process and after the meter has been placed in the field. Once authorized changes have been specified the meter is operative to verify that proper values have actually been placed in NVM and then relock the memory. The disclosed methods and apparatus eliminate the need to physically remove NVM in order to accomplish initialization, modification and/or reconfiguration by providing controlled access to all or part of the memory storing the hierarchy of secure data.

29 Claims, 7 Drawing Sheets

FIG. 4A

'CHANGE' LEVEL 0

| HEADER | | | | | | | | | |
|---|---|---|---|---|---|---|---|---|---|
| PARAMETER MESSAGE | FORMAT | OPERATIONAL INDICATOR (BLD8) | BCD7 | BCD6 | BCD5 | BCD4 | BCD3 | BCD2 | BCD1 |
| | | 0 0 0 0 | | | | | | | |
| | | $b_3\ b_2\ b_1\ b_0$ | | | | | | | |

40 — HEADER; 42 — FORMAT; 46 — OPERATIONAL INDICATOR; 44 — BCD7..BCD1

FIG. 4B

COMPARE (AND LOCK)' LEVEL 1

| HEADER | | | | | | | | | |
|---|---|---|---|---|---|---|---|---|---|
| PARAMETER MESSAGE | FORMAT | OPERATIONAL INDICATOR (BCD8') | BCD7' | BCD6' | BCD5' | BCD4' | BCD3' | BCD2' | BCD1' |
| | | 0 0 1 1 | | | | | | | |
| | | $b_3\ b_2\ b_1\ b_0$ | | | | | | | |

40A — HEADER; 42A — FORMAT; 46A — OPERATIONAL INDICATOR; 44A — BCD7'..BCD1'

FIG. 4C

'UNLOCK' LEVEL 3

| HEADER | | | | | | | | | |
|---|---|---|---|---|---|---|---|---|---|
| UNLOCK MESSAGE | FORMAT | OPERATIONAL INDICATOR (BCD8") | BCD7" | BCD6" | BCD5" | BCD4" | BCD3" | BCD2" | BCD1" |
| | | 0 1 1 0 | | | | | | | |
| | | $b_3\ b_2\ b_1\ b_0$ | | | | | | | |

FIG. 5

OPERATIONAL INDICATOR

```
0 0 0 0  ←——  CHANGE ——48 (LEVEL 0) SERIAL NUMBER
0 0 0 1  ←——  LOCK   ——50 (LEVEL 0) SERIAL NUMBER
0 0 1 0  ←——  CHANGE LEVEL 1
0 0 1 1  ←——  LOCK LEVEL 1
0 1 0 0       •
0 1 0 1       •
0 1 1 0       •
0 1 1 1       •
1 0 0 0       •
1 0 0 1       •
1 0 1 0       •
1 0 1 1       •
1 1 0 0       •
1 1 0 1       •
1 1 1 0  ←——  CHANGE LEVEL 7
1 1 1 1  ←——  LOCK LEVEL 7
```
$b_3\ b_2\ b_1\ b_0$ $\left\{ \begin{array}{l} \text{EVEN NUMBERS INDICATE 'CHANGE'} \\ \text{ODD NUMBERS INDICATE 'COMPARE (AND LOCK)'} \end{array} \right\}$ 8 LEVELS ARE DEPICTED AS
DEFINED BY $b_3\ b_2\ b_1$ BINARY
(LEVELS 0-7)

NONVOLATILE MEMORY UNLOCK FOR AN ELECTRONIC POSTAGE METER

FIELD OF THE INVENTION

The present invention relates to electronic meters, and more particularly, to an electronic postage meter having a nonvolatile memory adapted to contain therein a serial number for identifying the meter, accounting information and various parameterss specifying the meter's operating characteristics.

BACKGROUND OF THE INVENTION

Electronic meter systems have been developed, as for example the systems disclosed in U.S. Pat. No. 3,978,457 for MICROCOMPUTERIZED ELECTRONIC POSTAGE METER SYSTEM, in U.S. Pat. No. 3,938,095 for COMPUTER RESPONSIVE POSTAGE METER, in U.S. Pat. No. 4,301,507 for ELECTRONIC POSTAGE METER HAVING PLURAL COMPUTING SYSTEMS and in European patent application, Publication No. 0 019 515 for ELECTRONIC POSTAGE METER HAVING IMPROVED SECURITY AND FAULT TOLERANCE FEATURES.

Each of the electronic postage meters disclosed in the above-identified application and patents include a nonvolatile memory for retaining stored critical information when power is not applied to the meter. Various types of accounting information may be stored in the meter's nonvolatile memory. This information includes, for example, the amount of postage remaining in the meter for subsequent printing and the total amount of postage printed by the meter. Other types of accounting or operating data may also be stored in the nonvolatile memory. The function served by the nonvolatile memory circuits have replaced and enhanced the functions of the mechanical accounting registers or wheels utilized in previous mechanical type postage meters.

It has been recognized that during the assembly of electronic postage meters that it may be desirable to enter the serial number into the nonvolatile memory of the meter upon completion of the assembly operation. It is found that this can be done in electronic postage meters. In one such arrangement, a nonvolatile memory chip number is entered into the nonvolatile memory and is used during the assembly of the meter. The meter itself, however, is assembled with the final serial number on the meter body still utilizing a nonvolatile memory with a given chip number entered in the serial number field. When assembly and testing is completed, the final serial number is communicated to the meter.

It is also noted that a flag bit can be set if the path to the serial number in the nonvolatile memory is to be closed off so that the data field in the nonvolatile memory occupied by the serial number cannot be written. That is, writing into nonvolatile memory in the data field containing the serial number is prevented. Such a system is disclosed in U.S. patent application, Ser. No. 238,331 filed Feb. 26, 1981, now U.S. Pat. No. 4,424,,573, issued Jan. 3, 1984, for Alton B. Eckert, Jr. and Edward C. Duwel, and entitled "SYSTEM FOR ENTERING A POSTAGE METER SERIAL NUMBER INTO A NONVOLATILE MEMORY FROM AN EXTERNAL CHANNEL AFTER ASSEMBLY OF THE METER".

It has also been recognized that it may be desirable to provide methods and apparatus which enable the changing of a serial number in a meter until it is finally determined that the entered serial number is correct. This allows flexibility in case of erroneous key stroke and avoids loss in having meters fail the final assembly point because of inadvertent error which would require the entire meter to be disassembled to access the nonvolatile memory in the meter. Such methods and apparatus are disclosed in U.S. Pat. No. 4,506,329 to Duwel et al for NONVOLATILE MEMORY SERIAL NUMBER LOCK FOR ELECTRONIC POSTAGE METER.

According to the teachings of the '329 patent a serial number may be entered into the meter at the end of the manufacturing process after the meter has been assembled and the components tested by actuation of a routine programmed into a read only memory within the meter. This routine is used only once during the life of the meter nonvolatile memory. The routine requires the check of a nonvolatile memory bit position which is set once the routine has been successfully completed. The setting of this bit prevents reentry into the one time program. The program can be reused until the bit is set. The bit is set by comparison of the data included in a received message with the value of data contained in memory. If the comparison is true, the bit is set. The format of the received message entered into the meter to enter the serial number and set the bit requires an external message generator. The particular message format employed cannot be generated by actuation of the meter keyboard.

Furthermore, in accordance with the invention disclosed in the '329 patent, the serial number message format includes one digit as an operational indicator. If the serial number has been entered and the operational indicator is set to zero, the serial number in the random access memory of the meter will be changed to the value contained in the data message. If the operational indicator is set to a one, the firmware will cause the meter to operate to examine the serial number presently contained in the random access memory image of the nonvolatile memory and compare it with the value contained in the serial number message. If the result is favorable or true, the program will set the nonvolatile memory lock bit image in the random access memory thus preventing further access into this program once the image is written into the meter's nonvolatile memory.

SUMMARY OF THE INVENTION

It has been discovered that a system should desirably be provided that includes one or more nonvolatile memories (NVM) for storing a hierarchy of secure data including the meter's unique serial number, accounting information, and the various parameters which define its operating characteristics. The portion or portions of NVM containing the serial number and the aforementioned information and parameters may be totally or partially "locked" by firmware that causes one or more "lock bits" to be set. The setting of the lock bits is designed to prevent unauthorized access to a program which can alter the contents of predetermined portions of NVM.

The locations for storing the various levels of secure data in NVM may be defined apriori (i.e. be predetermined) by allocating portions of NVM for each of said levels. The defined levels may then be associated with each of the lock bits.

Furthermore, in accordance with the teachings of the invention, the disclosed postage meter is operable to insure the appropriate lock bit for a given level is "unlocked" when authorized personnel desire to enter the aforementioned program to initialize, modify and/or reconfigure the meter both during the manufacturing process and after the meter has been placed in the field. Once authorized changes at a given level have been specified the meter is operative to verify that proper values have actually been placed in NVM and then relock the memory, i.e. block access to the program which can alter NVM.

In an illustrative embodiment a postage meter is disclosed which comprises means for printing postage; computing means for accounting for printed postage; data entry means for entering messages into the computing means; one or more nonvolatile memories for storing a plurality of predetermined levels of secure data; and program storage means containing programs which control the operation of said computing means and which includes a program operable to identify which predetermined level of secure data, if any, is referenced by an entered message. This embodiment further includes a set of bit locks in NVM each uniquely associated with each one of the predetermined levels of secure data and a program operable to determine if the bit lock associated with an identified level is set.

According to the illustrative embodiment, messages may be entered to (1) unlock a level upon presentation of an appropriate authorization code, (2) change portions of NVM where authorized and (3) lock NVM after successfully making a specified change.

The disclosed methods and apparatus eliminate the need to physically remove the NVM in order to accomplish initialization, modification and/or reconfiguration by providing controlled access to all or part of the memory storing the secure hierarchy of data.

BRIEF DESCRIPTION OF THE DRAWINGS

FIGS. 4A-4C are diagrammatic representations of two types of messages that may be entered via the data entry means shown in FIG. 2; parameter messages (type 1, shown in FIGS. 4A and 4B), and an unlock message (type 2, shown in FIG. 4C), each of which include a header portion, a format portion, an operational indicator portion and a data portion.

FIG. 5 is a table of codes helpful in understanding the present invention; and

Reference is now made to the drawing wherein like reference numerals designate similar elements in the various views.

DETAILED DESCRIPTION

Figure 1:
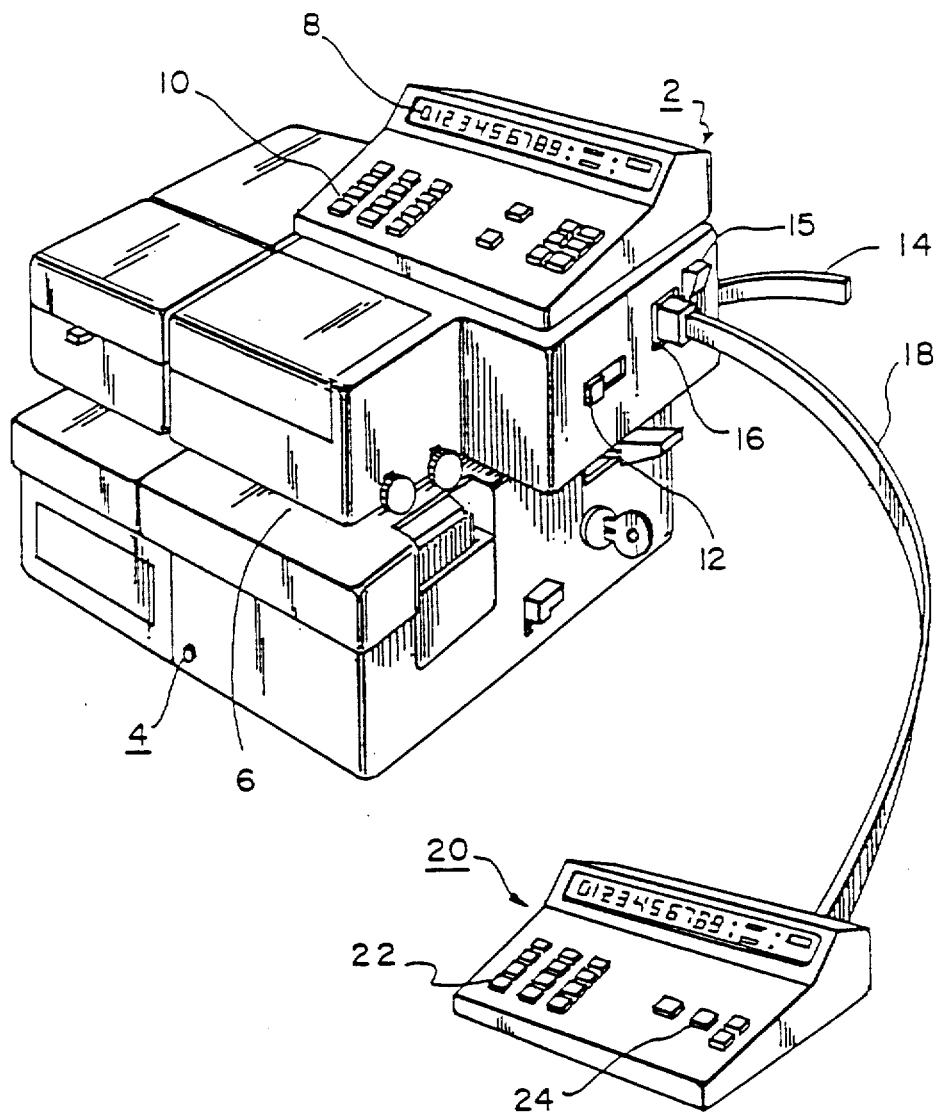
FIG. 1 is a perspective view of an electronic postage meter adapted to utilize the present invention.

Reference is now made to FIG. 1. FIG. 1 is a perspective view of a postage meter adapted to utilize the present invention. An electronic postage meter 2 is removably secured to a postage meter base 4. In this arrangement, a slot 6 is provided between the postage meter 2 and the base 4 at the forward edge thereof, for receiving envelopes or the like for the printing of postage thereon. The postage meter is provided with a display panel 8, preferably an electronic display device, as well as a control panel or keyboard 10.

The meter 2 includes a service mode switch 12. Power is applied to the meter 2 via an AC power line cord 14 when the meter power switch 15 is turned on. The meter also includes a communications port 16 which is connected by a communications cable 18 to an external message generator 20. The message generator is removable from the meter by detaching the cable 18 from the communications port 16. Communications between the meter 2 and the external message generator 20 may be in accordance with the serial communication echoplex technique described in U.S. Pat. No. 4,301,507 for ELECTRONIC POSTAGE METER HAVING PLURAL COMPUTING SYSTEMS.

As will be explained in greater detail hereinafter, the operation of the keyboard 10 of the electronic postage meter 2 differs from that of the keyboard 22 of the external message generator 20. The external message generator keyboard 22, with its unique keys 24 can invoke a routine in a read only memory in the external message generator 20 to generate a message with a unique header and format suitable to invoke a particular function in the electronic postage meter 2. That is, the keyboard 24 of the external message generator 20 can cause a message to be generated by the external message generator and communicated over communications channel 18 to the meter to invoke routine(s) stored in the read only memory of the electronic meter 2 which cannot be invoked by actuation of the meter keyboard 10.

Figure 2:
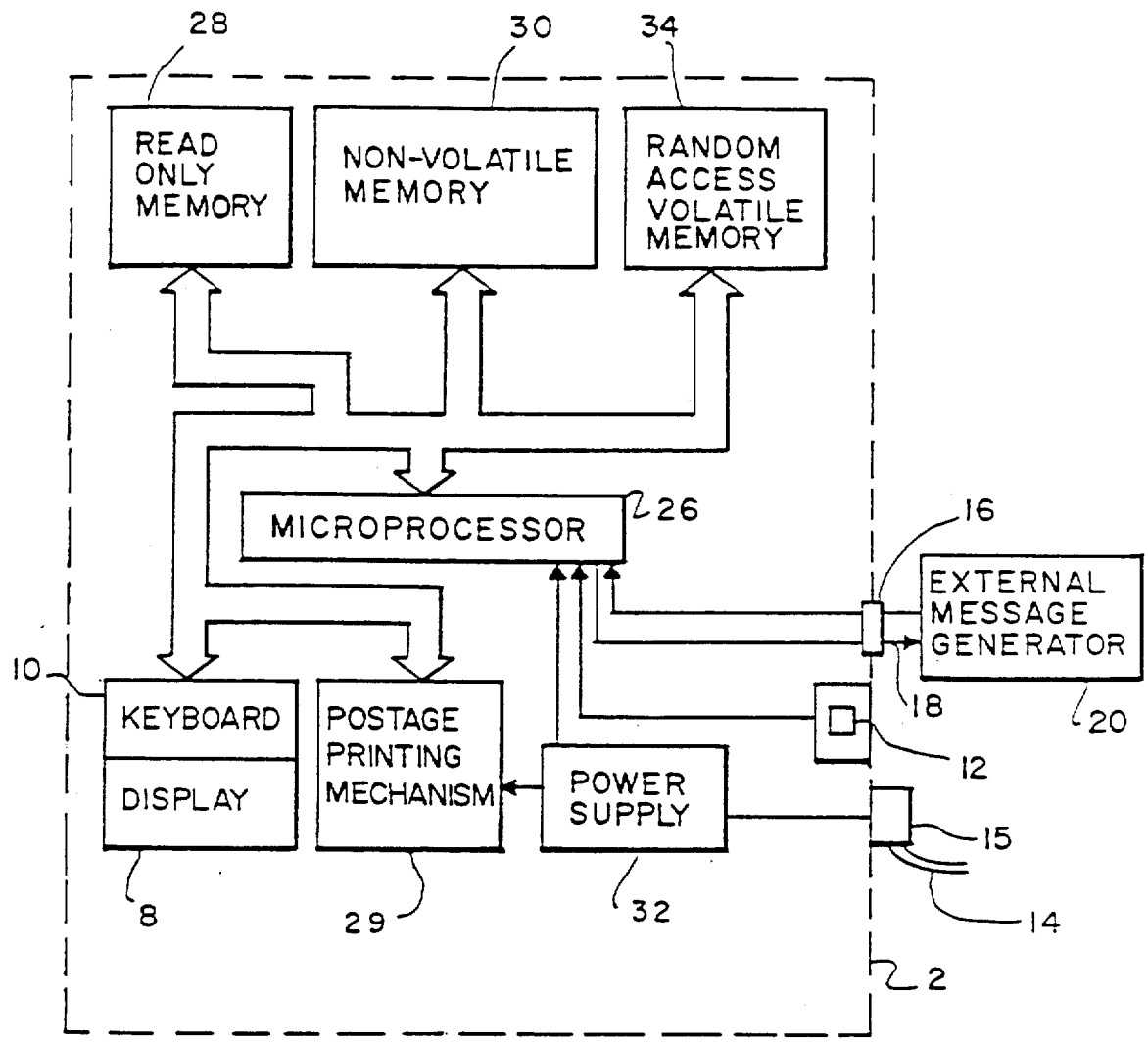
FIG. 2 is a block diagram showing one arrangement of the internal major components of an electronic postage meter embodying the present invention.

FIG. 2, which is a block diagram depicts one arrangement of the internal major components of an electronic meter embodying the present invention. The electronic postage meter 2 is controlled by a microprocessor 26 operated under control of a series of programs stored in a read only memory 28. Connected to the microprocessor are the keyboard 10 and display 8 as well as a postage printing mechanism 28. The microprocessor accepts information entered via the keyboard or via the communications port 16 from an external message generator 20 over the communications channel 18. Critical accounting and other information is stored in one or more nonvolatile memories such as nonvolatile memory 30. The nonvolatile memory may be an MOS semiconductor-type memory, a battery augmented CMOS memory, or other suitable nonvolatile memory component.

The function of nonvolatile memory is to store critical postage meter data during those times when the power is not applied to the meter. This data may include, in addition to the serial number of the meter, information as to the amount of the descending register (the amount of postage available for printing) the value of the ascending register (the total amount of postage printed by the meter), and the value of the piece count register (the total number of cycles the meter has performed), as well as other types of data, such as service information, which are desired to be retained in the memory when no power is applied to the meter.

The various types of data to be stored in NVM may be further characterized and classified by defining levels of security, i.e., a "hierarchy of secure data". This permits the reservation by design of portions of NVM for each of said levels.

By way of example, the serial number may be defined as "level 0" data, i.e. the most secure type of information stored in NVM. The postage meter can be designed so that this type of data may only be modified by a highly restricted set of persons given the "key" (e.g. an authorization code) to level 0. Money dependent parameters, for example a parameter indicating how much postage is available for printing, might also be defined as a level 0 parameter or as a parameter in any other level (i.e. in another secure portion of NVM) with limited access. Information such as the value of the maximum piece of postage that may be printed and routine service data may be assigned to other less secure "levels" i.e., be stored in portions of NVM reserved for data where controlled access to the program which can modify these other levels is open to a wider and/or different set of authorized personnel.

When the meter power switch 15 is turned on causing the power supply 32 internal to the meter to energize the microprocessor 26 and the postage printing mechanism 29, the information stored in the nonvolatile memory is transferred via the microprocessor to a volatile random access memory 34. The volatile, random access memory 34 after power up contains an image or copy of the information stored in nonvolatile memory prior to energization. During operation of the postage meter, data in the volatile, random access memory 34 is modified. Accordingly, when postage is printed, the descending register will be decremented, the ascending register incremented and the piece counter register incremented. When the power switch 18 is turned off, the modified image, the current updated data in the volatile, random access memory is transferred via the microprocessor back into a suitably prepared area of nonvolatile memory.

Thus, nonvolatile memory is updated during the power down cycle when the power switch 15 is turned off. A like transfer of information between nonvolatile memory and the volatile random access memory also occurs when the service mode switch 12 is actuated. Alternatively the NVM could be updated each time postage is printed, thus acting as random access memory during operation thereby eliminating the updating at initialization and power down time.

Figure 3:
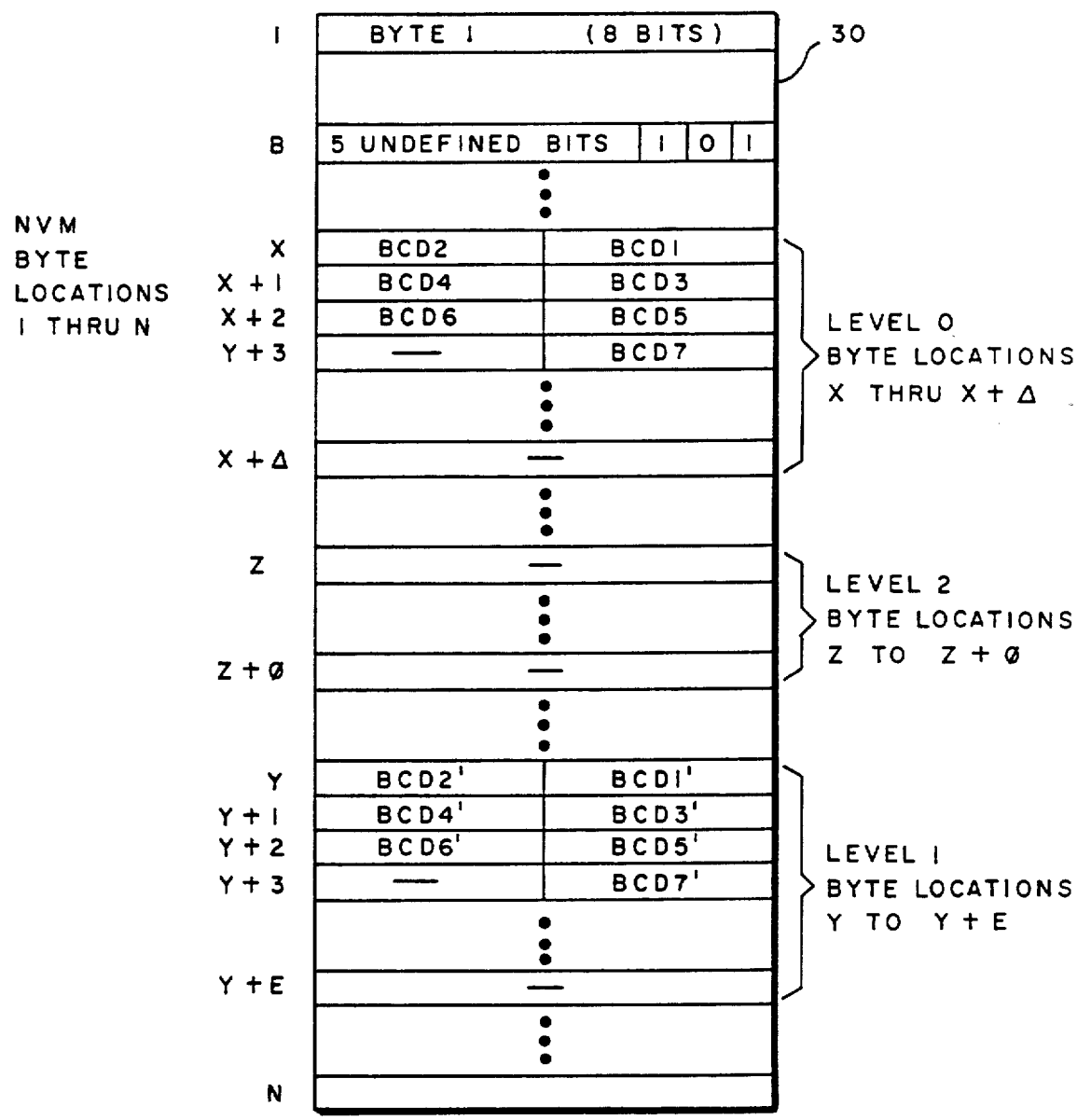
FIG. 3 is a partial memory map of the nonvolatile memory shown in FIG. 2 depicting placement of the serial number, a parameter, and three bit (for three level lock) indicator.

Reference is now made to FIG. 3 which depicts a partial memory map of nonvolatile memory 30 where, according to one embodiment of the invention, the byte locations for the serial number (to be stored as level 0 type data), an arbitrary level 1 parameter, a three bit (for a three level) lock indicator and unused space for a level two parameter are shown.

For the sake of illustration only, the n bytes of memory shown in FIG. 3 are organized so that all data defined as having a given security level (e.g., level 0, 1 or 2) are stored in a contiguous range of preallocated byte addresses. According to the illustrate example the memory allocated for level 0 data is the range of addresses X to X+Δ, the memory allocated for level 1 data is the range of addresses Y to Y+E and the level 2 range is shown as addresses Z to Z+∅. One or more levels of data may be predefined and allocated space, limited only by available storage capacity.

Also shown in the illustrative example is a 3 level lock bit indicator stored at byte address B. Here the 3 least significant bits of the depicted 8 bit byte are used to store the 3 bit lock indicator with level 0 being "locked" when the rightmost bit is set (shown as "1"), level 1 being locked where the next least significant bit is set and level 2 being locked where the most significant bit shown is set. A "zero" in any of these bits would indicate the respective level is "unlocked".

The lock indicator shown in FIG. 3 depicts levels 0 and 2 "locked", i.e. no access to the program which could alter memory locations X to X+Δ and Z to Z+∅ permitted; while at the same time the program that could modify unlocked level 1 locations Y to Y+E is accessable.

Obviously, other arrangements of bits, byte locations and memory states could be chosen to represent various levels and whether or not a given level is locked or unlocked without departing from the spirit or scope of the invention. Similarly, the data in a given level may be stored contiguously as shown in FIG. 3 or in any other fashion desirable by those skilled in the art.

The level 0 data shown in FIG. 3 is the 7 BCD nibble serial number shown stored right adjusted in byte locations X through X+3 along with data not shown in the left half of byte location X+3 and in byte locations X+4 through X+Δ. BCD7 is meant to represent the most significant digit of the serial number and BCD1 is the least significant digit. The level 1 data shown in FIG. 3 is a 7 nibble parameter comprised of BCD digits BCD1′ through BCD7′ stored in byte locations Y to Y+3 along with data not shown in the left half of byte location Y+3 and in byte locations Y+4 to Y+E.

Reference is now made to FIGS. 4A, 4B and 4C. According to one mode of the invention the parameter message "change" (or enter) data is shown in FIG. 4A, while a compare (and lock) message is shown in FIG. 4B. Each data message (type 1 and type 2) consists of a one byte (eight bits) header or identifier (40 and 40A), a format byte (42 and 42A) and four data bytes (44 and 44A) for a total of six bytes per message. Contained in the four data bytes of each message are a BCD operational indicator and seven binary coded digits, two per byte which may, for example, represent the serial number or any data to be stored in NVM. Header 40, and (40A) format 42 (and 42A) and data bytes 44 (and 44A) are as generally described in the aforementioned U.S. Pat. No. 4,301,507. The header provides identification of the unique type of message that follows, e.g. a parameter versus an unlock message.

For the sake of illustration only the parameter message in FIG. 4A (indicated in field 40) is shown with the serial number, BCD1 through BCD7, in the data field (44) and the operational indicator (indicating an instruction to change the level 0 serial number) is shown in field 46. FIG. 4B depicts a parameter message (indicated by header 40A) having BCD1′ through BDC7′ encoded in the data field (44A) and calls for a compare (and lock) of the level I parameter in field 44A. The compare (and lock) instruction and level I indication are shown in operational indicator field 46A. The format bytes (42 and 42A) each contain two BCD digits indicating the number of data digits to follow and the placement of the decimal point within these digits as described in the aforementioned '329 patent.

According to the preferred embodiment, the operational indicator BCD digits 46 and 46A indicate to the meter operating under the control of the firmware program contained in the read only memory 28 (FIG. 2) which operation at a given level, i.e. a change or compare (and lock), is to be performed. A zero in $b_0$ (FIG. 4A) could be defined to indicate a change operation and a one (as in FIG. 4B) could be defined to indicate a desire to compare (and lock). $b_3b_2b_1$ can be used to indicate which level is to be changed or compared (and locked). Thus, it can be seen that FIG. 4A depicts a command to change the serial number while FIG. 4B depicts a compare (and lock) command for a level 1 parameter. Undefined codes in the operational indicator will cause a procedural error message to be returned. If an instruction is not completed for any reason (e.g. an instruction to change the serial number when the serial number is locked) a procedural error will be returned.

FIG. 5 shows a table of useful codes for the operational indicator BCD digit. The first two codes 48 and 50 as previously noted will cause the meter to operate in accordance with the program routine to be described hereinafter. Procedural and fatal errors are described in U.S. Pat. No. 4,471,441 issued on Sept. 11, 1984 entitled ELECTRONIC POSTAL METER SYSTEM and in U.S. Pat. No. 4,251,874 entitled ELECTRONIC POSTAGE METER SYSTEM.

Finally, FIG. 4C depicts a command to unlock that level which is designated in the operational indicator bits $b_3b_2b_1$. Bit $b_0$ of the operational indicator field is undefined (always zero) in an unlock message. Nibbles BCD7" through BCD1" in FIG. 4C contain an authorization code which must be checked internally in the ROM program of the meter before the bits in NVM byte location B are changed to the unlocked state. (See FIG. 3). This could be a direct comparison with ROM data or it could undergo decoding using an algorithm such as the data encryption system (DES) algorithm found in remote meter resetting systems (RMRS) meters. The ROM program would determine which levels could be unlocked and which could never be unlocked thus maintaining security of the meter. According to the preferred embodiment of the invention the messages depicted in FIGS. 4A, 4B and 4C would only be accepted in the service mode, although this is not a requirement.

Figure 6A:
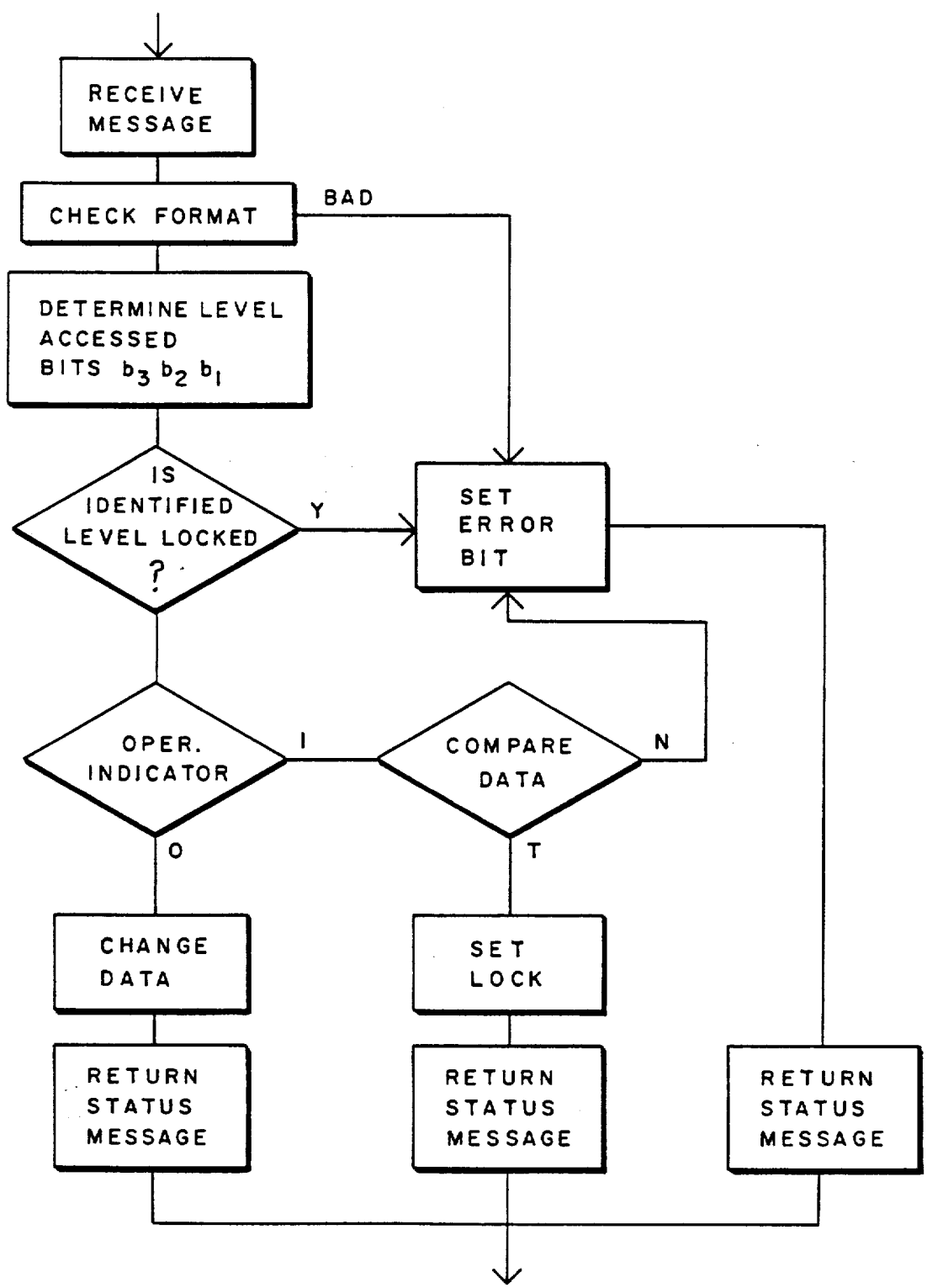
FIGS. 6A and 6B are flowcharts of firmware programs stored in the read only memory shown in FIG. 2.

Referring now to FIG. 6A, after the meter has been placed in the service mode by an externally generated message the external message generator generates a parameter message. For the sake of illustration only, presume a level 0 message "change serial number" is presented over the echoplex link and that this level is unlocked. It will become obvious that any other level of data presented by a presumably authorized person would be sufficient for the purpose of stepping through and explaining the flowchart shown in FIG. 6A.

Upon receipt of the parameter message, the firmware program of the meter causes the meter to check the message for proper formatting and returns a procedural error message if the format is not acceptable. If the format is acceptable, the firmware program causes the meter to determine the level being accessed. The actual address of the parameter being changed or compared could be determined in a variety of ways obvious to one skilled in the art without limiting the invention.

For example, the start address for level x could be stored in a table and the message header could contain an offset value (presuming all data in level x is stored in contiguous NVM locations) for the parameter being operated on. Once the level and actual address of the relevant parameter is determined the meter then examines the condition of the lock bit associated with the level of data presented. If the lock bit is set the firmware returns an error status message, an error bit is set and access to the firmware capable of modifying the data in the given level is denied. If the lock bit for the given level is cleared or "unlocked" the firmware program then causes the meter to examine the operational indicator hex digit contained in the input data message. If the operational indicator hex digit is a zero, the meter will change the data information in the volatile random access memory image to correspond to the data contained in the data portion of the input message. The meter will then return a status message to the external message generator.

If the operational indicator bit is set to the hex digit 1, the firmware will cause the meter to compare the data in the volatile random access memory to the data contained in the data portion of the input message. If the comparison is positive, the meter will set the volatile memory lock bit for the level just modified and return a status message to the external message generator. All other conditions that are tested and failed will return a procedural error message and will not set the lock bit for the level to which modification was attempted.

The information containing the data being inserted into NVM or the data and the appropriate lock bit contained in the data in the volatile random access memory is written into nonvolatile memory either upon power down of the meter or a mode change. Under normal conditions, the external message generator will send an exit service mode signal message to the meter. This message will cause the image in the volatile random access memory to be written into nonvolatile memory after the procedure is completed. The meter can be used to check the serial number and all other checks conducted during routine manufacturing stop checks and routine field checks through use of keyboard generated commands as described in co-pending application Ser. No. 447,901 dated Dec. 8, 1982, now U.S. Pat. No. 4,623,987 entitled POSTAGE METER WITH KEYBOARD KEYS FOR COMMANDING AND REQUESTING PERFORMANCE OF METER OPERATIONS, assigned to Pitney Bowes.

Figure 6B:
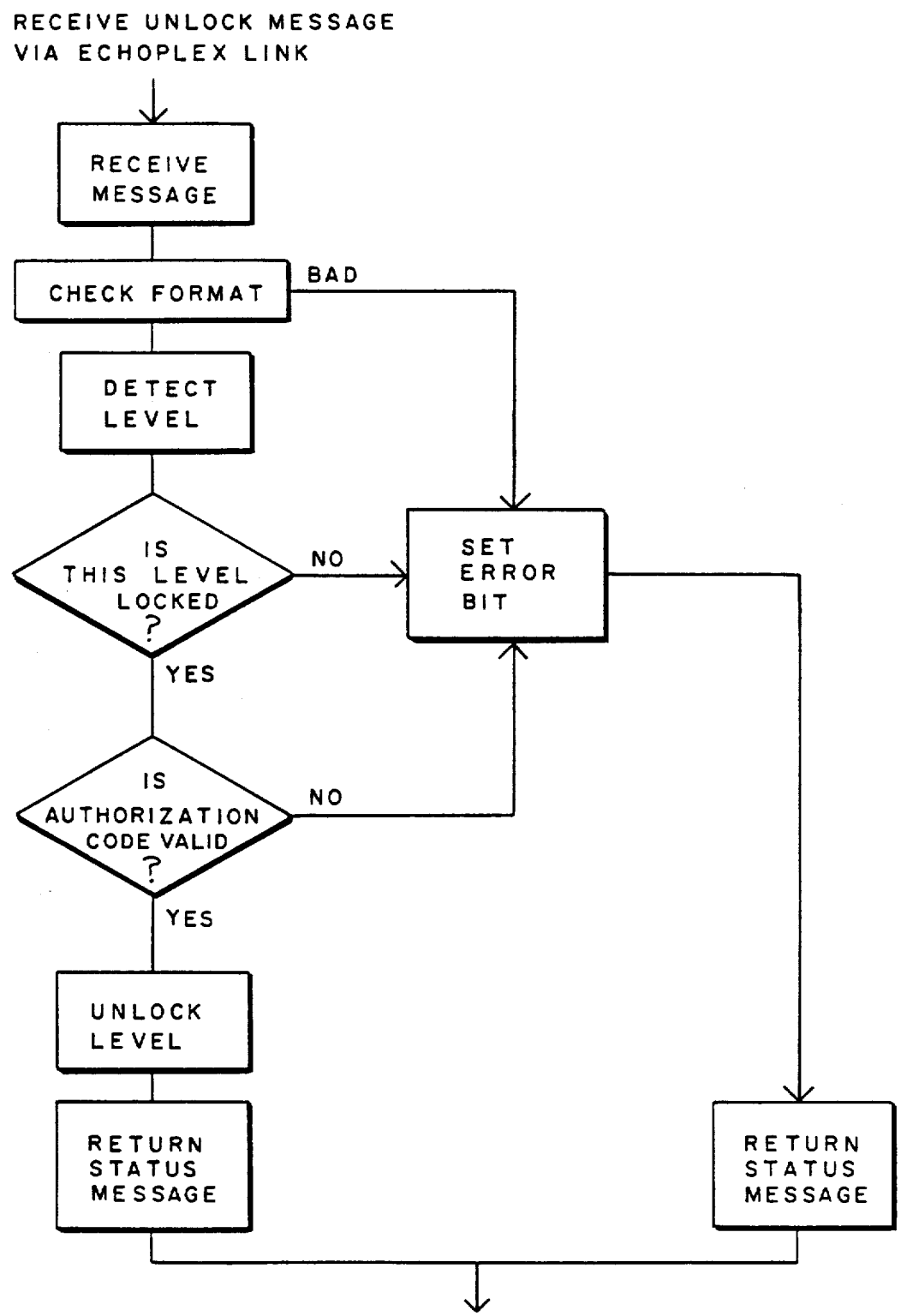

Referring now to FIG. 6B, after the meter has been placed in the service mode by an externally generated message the external message generator generates an unlock message. The unlock message is presented over the echoplex link to the meter through any available input means, for example, via message generator keyboard 2 (FIG. 1).

Upon receipt of the unlock message, the firmware program of the meter causes the meter to check the message for proper formatting and returns a procedural error message if the format is not acceptable. If the format is acceptable, the firmware program causes the meter to determine the level being accessed for unlocking. The meter then examines the condition of the lock bit associated with the level requested. If the lock bit is set, the firmware compares the authorization code presented with the secure level sought to be accessed for unlocking. If the authorization code is improperly entered or not appropriate to permit unlocking the specified level, an error status message is returned, an error bit is set and access to the firmware capable of modifying the data in the given level is denied. If the authorization code is appropriate, the lock bit for the given level is cleared or "unlocked" and the firmware proceeds to return a successful status message. Data may now be changed in accordance with the flowcharts shown in FIG. 6A.

It should be noted that in the Service Mode, the Enter Combination, Enter Amount, and End of Entry message available on the meter could be used to perform the previous tasks. In this case, the Enter Combination message would be equivalent to the header and the Enter Amount message would supply the operational indicator and the data field.

It should be recognized that it is known and understood as used herein the terms postage meter and postal meter refer to the general definition of a device for the imprinting of a defined unit value for governmental or private carrier, delivery such as parcels or envelopes or other like application for unit value printing. Thus, the term postage meter is utilized as it is both known and employed in the trade, as a general term for devices utilized in conjunction with services other than those exclusively provided by governmental postal services. For example, private parcel or freight services purchase and employ postal meters as a means to provide unit value printing for, and such meters include, accounting and printing functions.

While the present invention has been disclosed and described with reference to a single embodiment thereof, it will be apparent that variations and modifications may be made therein. For example, in an alternative embodiment of the invention, a separate unlock message (as depicted in FIG. 4C), for unlocking a level, could be eliminated if the data presented in a parameter message is designed to inherently reflect the level of the parameter being accessed. In such an arrangement, FIGS. 6A and 6B could be combined to always check an authorization code before allowing a change or compare (and lock) operation to be executed. The firmware to support this arrangement might first determine the level being accepted and then request the user to input an authorization code via the message generator before further processing of a parameter message. A table lookup could be performed to determine if the authorization code is valid.

It is intended in the following claims to cover each such variation and modification as falls within the true spirit and scope of the invention.

What is claimed is:

1. A postage meter comprising:
   (a) printing means for printing postage;
   (b) computing means coupled to said printing means for accounting for postage printed by said printing means;
   (c) data entry means coupled to said computing means for entering messages into said computing means;
   (d) nonvolatile memory means coupled to said computing means for storing a plurality of predetermined levels of secure data, said nonvolatile means having a set of bit locks each uniquely associated with each one of said predetermined levels of secure data; and
   (e) program storage means coupled to said computing means adapted to store a set of programs which control the operation of said computing means and which includes a first program operable to identify which of said plurality of predetermined levels of secure data, if any, is referenced by an entered message, and a second program operable to determine if the bit lock associated with an identified level is set.

2. A postage meter as set forth in claim 1 wherein each message entered via said data entry means comprises a data portion containing an authorization code and one of a plurality of predefined operational indicator codes wherein a third one of said codes enables a sixth stored program to unlock said bit lock if said authorization code is valid.

3. A postage meter as defined in claim 1 wherein said second program is further operable, if said bit lock is set, to process an authorization code and determine if the message entered via said data entry means is an authorized entry.

4. A postage meter as defined in claim 3 wherein said second program is further operable to signal an error condition if an unauthorized entry is present and unlock the identified level by clearing its associated bit lock if the entry is determined to be authorized.

5. A postage meter as set forth in claim 1 wherein each message entered via said data entry means comprises a data portion and one of a plurality of predefined operational indicator codes wherein a first one of said codes enables a third stored program to signal that the data portion of said entered message is to be stored at a predetermined address in nonvolatile memory if the bit lock associated with said identified level is clear.

6. A postage meter as set forth in claim 5 further comprising a volatile random access memory coupled to said computing means wherein said third program is further operable to store the data portion of said entered message in said nonvolatile memory by first storing said data in said volatile memory and later writing said data into said nonvolatile memory upon actuation of a switch coupled to said computing means.

7. A postage meter as set forth in claim 1 wherein each message entered via said data entry means comprises a data portion and one of a plurality of predefined operational indicator codes wherein a second one of said codes enables a fourth stored program to signal that the data portion of said entered message is to be compared with data previously entered and stored at a predetermined address in nonvolatile memory if the bit lock associated with said identified level is clear.

8. A postage meter as set forth in claim 7 wherein a fifth stored program is operable to compare the data portion of said entered message with said previously entered data and signal an error condition if the comparison is false and set the bit lock for the identified level if the comparison is true thereby securing the data in nonvolatile memory.

9. A postage meter as defined in claim 1 wherein said computing means comprises a microprocessor and where said data entry means include an external communications port coupled to said microprocessor and adapted to interact with an external message generator adapted to generate messages.

10. A postage meter as defined in claim 9 including a keyboard coupled to said computing means and wherein said message generator includes a format which is not capable of being generated from said meter keyboard.

11. A postage meter comprising:
   (a) printing means for printing postage;
   (b) computing means coupled to said printing means for accounting for postage printed by said printing means;
   (c) data entry means coupled to said computing means for entering messages into said computing means;
   (d) nonvolatile memory means coupled to said computing means for storing a plurality of predetermined levels of secure data and for storing bit lock for each of said levels of data; and (e) program storage means coupled to said computing means adapted to store a set of programs which control the operation of said computing means and which includes a first program operable to identify which of said plurality of predetermined levels of secure data, if any, is referenced by an entered message and a second program operable to determine if the bit lock associated with an identified level is set and if set process an authorization input code to determine if the entered message is authorized, signal an error condition whenever an unauthorized entry is present and unlock the identified level by clearing the associated bit lock whenever an entry is determined to be authorized.

12. A postage meter as set forth in claim 11 wherein each message entered via said data entry means comprises a data portion and one of a plurality of predefined operational indicator codes and further wherein said program store contains a third program, operable, in response to an entered message whenever the referenced level is unlocked, to store the data portion of said entered message in a predetermined address in nonvolatile memory if said operational indicator code is predefined as a change operation, and perform a comparison between the data portion of said entered message and data previously entered and stored at a predetermined address in nonvolatile memory if said operational indicator code is predefined as a compare operation, signaling an error condition if said comparison is false and setting the bit lock for the identified level if the comparison is true to thereby secure the data in nonvolatile memory.

13. A postage meter as defined in claim 12 wherein said data entry means includes an external communications port coupled to said computing means and adapted to interact with an external message generator adapted to generate said messages.

14. A postage meter as defined in claim 13 further including a meter keyboard coupled to said computing means and wherein said data entry means further includes a second keyboard coupled to said computing means and wherein said messages include a format which are not capable of being generated from said meter keyboard.

15. A postage meter as set forth in claim 12 further comprising a volatile random access memory coupled to said computing means wherein said third program is further operable to store the data portion of said entered message in said nonvolatile memory by first storing said data in said volatile memory and later writing said data into said nonvolatile memory upon actuation of a switch coupled to said computing means.

16. A postage meter as defined in claim 15 wherein said switch is a power switch.

17. A postage meter as defined in claim 15 where said switch is a service mode switch.

18. A postage meter as defined in claim 17 wherein said computing means is a microprocessor.

19. A postage meter comprising:
(a) printing means for printing postage;
(b) computing means coupled to said printing means for accounting for postage printed by said printing means;
(c) data entry means coupled to said computing means for entering messages, each comprising a data portion and one of a plurality of predefined operational indicator codes, into said computing means;

(d) nonvolatile memory means coupled to said computing means for storing a plurality of predetermined levels of secure data and for storing a bit lock for each of said levels of data; and program storage means coupled to said computing means adapted to store a set of programs which control the operation of said computing means and which includes a program operable to identify which of said plurality of predetermined levels of secure data, if any, is referenced by an entered message, to determine if the bit lock associated with an identified level is set and if set to process an authorization input code to determine if the entered message is authorized, to signal an error condition whenever an authorized entry is present, to unlock the identified level by clearing the associated bit lock and determine which of said predefined operational indicator codes is present whenever an entry is determined to be authorized, to store the data portion of said entered message in a predetermined address in nonvolatile memory whenever said operational indicator code is predefined as a store operation and to perform a comparison between the data portion of said entered message and data previously entered and stored at a predetermined address in nonvolatile memory whenever said operational indicator code is predefined as a compare operation, to signal an error condition if said comparison is false and set the bit lock for the identified level if the comparison is true to thereby secure the data in nonvolatile memory.

20. A method for initializing, modifying and reconfiguring a postage meter, wherein said meter comprises printing means for printing postage, computing means coupled to said printing means for accounting for postage printed by said printing means, data entry means coupled to said computing means for entering into said computing means messages each of which include data, nonvolatile memory means coupled to said computing means for storing a plurality of predetermined levels of secure data and for storing a bit lock for each of said levels of data, comprising the steps of:
(a) entering a message into said postage meter via said data entry means;
(b) identifying which of said plurality of predetermined levels of secure data, if any, is referenced by said entered message; and
(c) determining if the bit lock associated with an identified level is set.

21. A method as set forth in claim 20 further comprising the steps of:
(a) processing an authorization input code to determine if the entered message is authorized;
(b) signaling an error condition whenever an unauthorized entry is present; and
(c) unlocking the identified level by clearing the associated bit lock whenever the entry is determined to be authorized.

22. A method as set forth in claim 21 wherein each of said messages further comprises one of a plurality of predefined operational indicator codes.

23. A method as set forth in claim 22 further comprising the steps of:
(a) identifying which of said predefined operational indicator codes is present; and
(b) storing the data portion of said entered message in a predetermined address in nonvolatile memory whenever said operational indicator code is predefined as a store operation.

24. A method as set forth in claim 23 further comprising the steps of:
   (a) comparing the data portion of said entered message with data previously entered and stored at a predetermined address in nonvolatile memory whenever said operational indicator code ispredefined as a compare operation; and
   (b) setting the bit lock for the identified level if the comparison is true to thereby secure the data in nonvolatile memory.

25. A method as set forth in claim 24 further comprising the step of signaling an error condition if said comparison is false.

26. A method for initializing, modifying and reconfiguring a postage meter, wherein said meter comprises printing means for printing postage, computing means coupled to said printing means for accounting for postage printed by said printing means, data entry means coupled to said computing means for entering into said computing means messages each of which comprise a data portion and one of a plurality of predefined operational indicator codes, nonvolatile memory means coupled to said computing means for storing a plurality of predetermined levels of secure data and for storing a bit lock for each of said levels of data, comprising the steps of:
   (a) entering a message into said postage meter via said data entry means;
   (b) identifying which of said plurality of predetermined levels of secure data, if any, is referenced by said entered message;
   (c) determining if the bit lock associated with said identified level is set and if set processing an authorization input code to determine if the entered message is authorized;
   (d) signaling an error condition whenever an unauthorized entry is present;
   (e) unlocking the identified level by clearing the associated bit lock and determining which of said plurality of operational indicator codes is present whenever an entry is determined to be authorized;
   (f) storing the data portion of said entered message in a predetermined address in nonvolatile memory whenever said operational indicator code is predefined to as a store operation;
   (g) comparing the data portion of said entered message with data previously entered and stored at a predetermined address in nonvolatile memory whenever said operational indicator code is predefined as a compare operation;
   (h) signaling an error condition if the comparison is false; and
   (i) setting the bit lock for the identified level if the comparison is true to thereby secure the data in nonvolatile memory.

27. A method for initializing, modifying and reconfiguring a postage meter, wherein said meter comprises printing means for printing postage, computing means coupled to said printing means for accounting for postage printed by said printing means, data entry means coupled to said computing means for entering into said computing means messages each of which comprises a header, a data portion and one of a plurality of predefined operational indicator codes, nonvolatile memory means coupled to said computing means for storing a plurality of predetermined levels of secure data and for storing a bit lock for each of said levels of data, comprising the steps of:
   (a) entering a message into said postage meter via said data entry means; and
   (b) identifying the type of entered message with reference to said header.

28. A method as set forth in claim 27 which, whenever said header is identified as an unlock message, further comprises the steps of:
   (a) identifying which of said plurality of predetermined levels of secure data, if any, is referenced by the entered message;
   (b) determining if the bit lock associated with said identified level is set and if set processing an authorization code contained in said data portion of the entered message to determine if the entered message is authorized;
   (c) signaling an error condition whenever an unauthorized entry is present; and
   (d) unlocking the identified level by clearing the associated bit lock whenever an entry is determined to be authorized.

29. A method as set forth in claim 27 which, whenever said header is identified as a parameter message, further comprises the steps of:
   (a) identifying which of said plurality of predetermined levels of secure data, if any, is referenced by said entered message;
   (b) signaling an error condition if an identified level is locked;
   (c) determining which of said plurality of operational indicator codes is present;
   (d) storing the data portion of said entered message in a predetermined address in nonvolatile memory whenever said operational indicator code is predefined as a store operation;
   (e) comparing the data portion of said entered message with data previously entered and stored at a predetermined address in nonvolatile memory whenever said operational indicator code is predefined as a compare operation;
   (f) signaling an error condition if the comparison is false; and
   (g) setting the bit lock for the identified level if the comparison is true to thereby secure the data in nonvolatile memory.

* * * * *